United States Patent
Iida et al.

(10) Patent No.: US 6,990,554 B2
(45) Date of Patent: Jan. 24, 2006

(54) DATA REWRITING APPARATUS, CONTROL METHOD, AND RECORDING MEDIUM

(75) Inventors: Kenichi Iida, Saitama (JP); Mari Noguchi, Tokyo (JP); Shuji Ohbayashi, Saitama (JP)

(73) Assignee: Sony Corporation, Tokyo (JP)

( * ) Notice: Subject to any disclaimer, the term of this patent is extended or adjusted under 35 U.S.C. 154(b) by 132 days.

(21) Appl. No.: 10/616,211

(22) Filed: Jul. 9, 2003

(65) Prior Publication Data

US 2004/0107309 A1 Jun. 3, 2004

Related U.S. Application Data

(62) Division of application No. 09/693,125, filed on Oct. 20, 2000, now Pat. No. 6,662,269.

(30) Foreign Application Priority Data

Oct. 22, 1999 (JP) .......................................... P11-301335
Sep. 27, 2000 (JP) ..................................... P2000-294387

(51) Int. Cl.
*G06F 12/00* (2006.01)
*G06F 13/00* (2006.01)

(52) U.S. Cl. ........................ 711/115; 711/100; 711/103; 711/115; 711/154

(58) Field of Classification Search ................. 711/100, 711/102, 104, 154, 103, 170; 713/1, 172, 713/30.01; 369/29.02, 30.4
See application file for complete search history.

(56) References Cited

U.S. PATENT DOCUMENTS

| | | | |
|---|---|---|---|
| 6,215,746 B1 * | 4/2001 | Ando et al. ................. | 369/53.2 |
| 6,226,739 B1 * | 5/2001 | Eagle ............................ | 713/1 |
| 6,305,603 B1 * | 10/2001 | Grunbok et al. ............ | 235/379 |
| 6,405,049 B2 * | 6/2002 | Herrod et al. .............. | 455/517 |
| 6,542,445 B2 * | 4/2003 | Ijichi et al. ............... | 369/30.08 |
| 2001/0054148 A1 * | 12/2001 | Hoornaert et al. .......... | 713/172 |

* cited by examiner

*Primary Examiner*—Tuan V. Thai
(74) *Attorney, Agent, or Firm*—Jay H. Maioli

(57) ABSTRACT

A recording medium for rewriting the data stored in a nonvolatile memory limited in rewriting, provided in the apparatus, through the use of a program for executing an update supplied from a detachable recording medium and data used in updating.

2 Claims, 8 Drawing Sheets

FIG. 7A — When loading from personal computer

| | 0x00 | 0x01 | 0x02 | 0x03 | 0x04 | 0x05 | 0x06 | 0x07 | 0x08 | 0x09 | 0x0A | 0x0B | 0x0C | 0x0D | 0x0E | 0x0F |
|---|---|---|---|---|---|---|---|---|---|---|---|---|---|---|---|---|
| 0x0000 | A | B | C | D | E | F | M | E | M | S | T | I | C | K |   |   |
| 0x0010 |   |   |   |   |   |   |   |   |   |   |   |   |   |   |   |   |
| 0x0020 | L | O | A | D | F | R | O | M | P | C | A | D | E | R | 3 | 2 |

FIG. 7B — When loading from plate memory

| | 0x00 | 0x01 | 0x02 | 0x03 | 0x04 | 0x05 | 0x06 | 0x07 | 0x08 | 0x09 | 0x0A | 0x0B | 0x0C | 0x0D | 0x0E | 0x0F |
|---|---|---|---|---|---|---|---|---|---|---|---|---|---|---|---|---|
| 0x0000 | A | B | C | D | E | F | M | E | M | S | T | I | C | K |   |   |
| 0x0010 |   |   |   |   |   |   |   |   |   |   |   |   |   |   |   |   |
| 0x0020 | L | O | A | D | F | R | O | M | M | S | A | S | D | E | R | 1 |

FIG. 7C

| | 0x00 | 0x01 | 0x02 | 0x03 | 0x04 | 0x05 | 0x06 | 0x07 | 0x08 | 0x09 | 0x0A | 0x0B | 0x0C | 0x0D | 0x0E | 0x0F |
|---|---|---|---|---|---|---|---|---|---|---|---|---|---|---|---|---|
| 0x0000 | A | B | C | D | E | F | M | E | M | S | T | I | C | K |   |   |
| 0x0010 |   |   |   |   |   |   |   |   |   |   |   |   |   |   |   |   |
| 0x0020 | r | o | m | d | e | r | a | . | d | a | t |   |   |   |   |   |
| 0x0030 | 0x00A3 | 0x003F | 0xFFFF |   |   |   |   |   |   |   |   |   |   |   |   |   |

FIG. 7D

| | 0x00 | 0x01 | 0x02 | 0x03 | 0x04 | 0x05 | 0x06 | 0x07 | 0x08 | 0x09 | 0x0A | 0x0B | 0x0C | 0x0D | 0x0E | 0x0F |
|---|---|---|---|---|---|---|---|---|---|---|---|---|---|---|---|---|
| 0x0000 | A | B | C | D | E | F | M | E | M | S | T | I | C | K |   |   |
| 0x0010 |   |   |   |   |   |   |   |   |   |   |   |   |   |   |   |   |
| 0x0020 | l | o | a | d | e | r | . | . | d | a | t |   |   |   |   |   |
| 0x0030 | 0x0041 | 0xFFFF |   |   |   |   |   |   |   |   |   |   |   |   |   |   |

DATA REWRITING APPARATUS, CONTROL METHOD, AND RECORDING MEDIUM

This is a division of Application Ser. No. 09/693,125, filed Oct. 20, 2000, now U.S. Pat. No. 6,662,269.

BACKGROUND OF THE INVENTION

1. Field of the Invention

The present invention relates to a data rewriting apparatus for updating the data recording in a nonvolatile memory provided in an apparatus and limited in rewriting, on the basis of an updating program and updating data supplied from a detachable recording medium in the apparatus, and also a control method and a recording medium.

2. Description of the Related Art

In certain microcomputers incorporated in personal digital assistants, at present, a ROM data storage area for storing programs is used as a flash memory, and there is a function of rewriting the program for controlling the apparatus stored in the flash memory or the data necessary when operating the program from outside, for the purpose of adding a function of the apparatus or enhancing the performance, for example, after mounting on the substrate. Usually, in such microcomputers, the serial interface to be provided as part of the function or the serial communication interface for realizing rewriting from outside of the apparatus is provided in the apparatus, and it is designed to write the ROM data from an external writing device by using serial communication.

Generally, rewriting operation of ROM data for such function addition or function enhancement is a very dangerous task that determines the operation of the apparatus, and it is designed not to get into a writing state easily by mistake. Therefore, conventionally, when rewriting the ROM data, for example, at a service center or a repair shop, by opening the cover of the apparatus to be accessible to the inside parts, a hard wiring such as jumper wire for transmitting a control signal necessary for getting into rewriting operation is soldered, or physical operation is required such as changeover of wiring or changeover of switch, so that the program for rewriting the ROM data stored in the apparatus may not be put into the ROM data rewriting operation by mistake by the user or other accident.

In a car navigation system, a CD-ROM for rewriting ROM data or the like is loaded in the navigation system, and the ROM data is rewritten by a program loader provided in the navigation system having a stable power source, so that a new function is added or navigation data is updated.

Further, in an Internet router, to use a new Internet protocol or network application program, for example, or to add newly a program for protecting the LAN (local area network) from cracking, by a program for downloading a file for updating provided in the router, a ROM data rewriting file is supplied from the server into the router, and the ROM data is similarly rewritten by the program loader provided in the router having a stable power source.

Lately, by forming a small storage medium having a solid memory element such as flash memory, it is proposed to store computer data, video data and audio data by using an exclusive drive device or incorporating a drive device in an audio and video appliance or information device.

However, such ROM data rewriting operation requires changeover of electric circuit of the apparatus in order to avoid rewriting of ROM data by mistake, and if the apparatus is disassembled by the service engineering or service provider, or the program is rewritten by the user, it is necessary to prepare special tools and connect to the specified external terminal of the apparatus, which was very inconvenient.

Or, in the personal digital assistant in which the power source is not stable, the operation of the microcomputer may become unstable due to sudden fluctuations or a drop of the supply voltage, or, in a worst case, the program for rewriting the ROM data may be put into operation by runaway, and therefore the program loader for rewriting the ROM data cannot be provided in the apparatus, which was also inconvenient.

In the storage system using such solid memory element, it is demanded to process the stored file efficiently. For example, it is required that the data moving, duplication and rewriting necessary for file processing in the storage medium should be a minimum limit, or that the processing time and power consumption should be a minimum limit.

By contrast, in the development environment of many programs such as ROM data mentioned above, since the FAT (file allocation table) is used as the file system, it is convenient for copying the ROM data if the ROM data is described as a file system such as FAT in the case of writing ROM data into the microcomputer through a recording medium. In this case, however, it is required on the apparatus side to interpret the file system of a relatively large scale such as FAT, and hence processing of recorded data is very complicated.

More specifically, between a physical address for using the physical access to the flash memory, and a logical address for processing the data in the logic space by using the FAT, the address converting operation is required in the memory access driver unit in the apparatus, by using a logic-physical address conversion table for converting, for example, between the logical address handled in the logic space provided on the flash memory and the physical address used when actually accessing the flash memory. Further, on the preliminary condition of the physical specification that the erasing unit of flash memory is greater than the writing unit. In the FAT, moreover, since the data is accessed by using the recording capable of overwriting the data, when using the flash memory required to writer after erasing, the erasing process and writing process on the flash memory must be also done in the memory access driver when a writing request is made in the FAT.

When using the FAT as the file system, usually, the process of opening the file and writing the data is needed when writing the data, but as the internal processing in the apparatus at this time, it requires block swapping process of changing or partly erasing the data to be done by changing the logical address to the logical address before change by writing the changed data into the block of the specified physical address already erased in the erasing unit of the flash memory, and also the process of converting the logical address used by the FAT file system and the physical address which is the physical allocation sequence of the flash memory by means of the conversion table, and such complicated process took much time and labor.

SUMMARY OF THE INVENTION

The present invention presents a data rewriting apparatus capable of detaching a recording medium which stores update data for updating the data stored in the data rewriting apparatus, program data for transferring the update data to the data rewriting apparatus, and discrimination data for discriminating recording of the update data and program data, comprising:

loading means for inserting the detachable recording medium into the apparatus main body, first memory means for reading and storing the program data for transferring the update data into the data rewriting apparatus recorded on the recording medium, detecting means for detecting the discriminating data from the recording medium, second memory means provided inside the rewriting apparatus for storing the data to be updated, and control means for reading out the program data for transferring the update data into the data rewriting apparatus on the basis of the detected discriminated data from the recording medium and storing into the first memory means, when the discriminating data is detected from the recording medium by the detecting means, reading out the updated data recorded in the recording medium on the basis of the program data stored in the first memory means, and updating the data stored in the second memory means in the data rewriting apparatus.

Further, the present invention also presents a control method of storing update data by transferring into a data rewriting apparatus from the data rewriting apparatus and a detachable recording medium storing update data for updating the data stored in the data rewriting apparatus, program data for transferring the update data to the data rewriting apparatus, and discrimination data for discriminating recording of the update date and program data, comprising:

a step of detecting the discrimination data from the recording medium, a step of reading out the program data from the recording medium on the basis of the detected discrimination data when the discrimination data is detected from the recording medium, and a step of reading out the update data for updating the data stored in the data rewriting apparatus from the recording medium on the basis of the program data being readout, and updating the data stored in the apparatus by the update data being read out.

In the invention, moreover, the recording medium comprises:

an update data recording region for recording the update data for updating the data stored in the installed data rewriting apparatus, a program data recording region for recording the program data for transferring the update data to the data rewriting apparatus, and a discrimination data recording region or recording the discrimination data for discriminating recording of the update data and program data.

DESCRIPTION OF THE DRAWINGS

FIG. 7A shows examples of header data according to the embodiment, particularly relating to the header data on the discrimination file and the header data in the case of loading from the personal computer;

FIG. 7B shows examples of header data according to the embodiment, particularly relating to the header data to the discrimination file and the header data in the case of loading from the plate memory;

FIG. 7C shows examples of header data according to the embodiment, particularly relating to the program loader file and header data of ROM data file.

DETAILED DESCRIPTION OF THE
PREFERRED EMBODIMENT

A preferred embodiment of the invention is described below. The storage medium of the embodiment is a plate memory having a plate shape, and the personal digital assistant of the invention corresponds to a portable terminal capable of recording and reproducing a file on a plate memory.

[Shape of plate memory] First, the shape of the plate memory, the storage medium of the embodiment, is explained. The plate memory has a memory element of a specific capacity in the plate casing. For example, a flash memory is used as the memory element.

From the lower part of the front of the casing to the bottom side, there is a terminal section having nine electrodes, and from this terminal section, reading or writing is operated on the inside memory element through the detachable mechanism of the portable terminal main body side. There is a notch in the upper left portion in the plane direction of the casing. This notch is formed in order to prevent insertion in a wrong direction when loading this plate memory into the detachable mechanism of the portable terminal main body side. Further at the bottom side, there is a slide switch for preventing erasure of memory by mistake.

Figure 1:
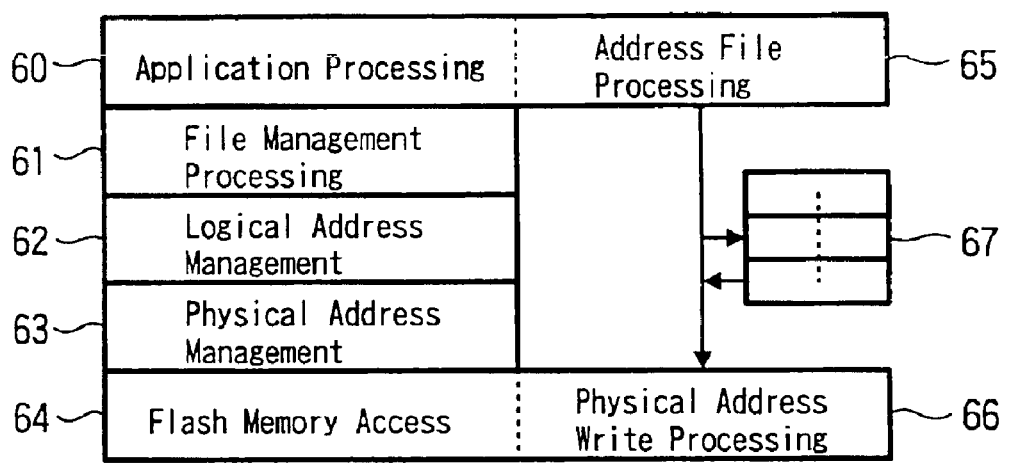
FIG. 1 is an explanatory diagram of a file system processing hierarchy according to an embodiment of the invention.

[Format of plate memory] [Memory file system processing hierarchy] The format of the plate memory in the system is explained. FIG. 1 shows the file system processing hierarchy in the system using the plate memory as the storage medium. As shown in FIG. 1, the file system processing hierarchy consists of a file management processing layer 61, a logical address layer 62, a physical address layer 63, and a flash memory access layer 64, which are sequentially formed beneath an application processing layer 60. In this hierarchy, the file management processing layer 61 is the so-called FAT (file allocation table). As known from the diagram, in the file system of the embodiment, the concept of logical address and physical address is introduced, which is described later.

In particular, in the embodiment, in the application processing layer 60, there is an address file processing unit 65 for startng processing of the address file by performing input operation for processing to generate the address of program loader file storing the rewriting program for executing a rewrite of the program data described later by an exclusive device and the ROM data file storing the program data, and in this case, immediately, by referring to the physical address table 67 place, for example, in the RAM, the physical address on the flash memory corresponding to the logical address of the specified index file is acquired, and the physical address is written by a physical address write processing unit 66 provided in the flash memory access layer 64. Then the ROM data file is written by using the program loader file in the personal data assistant described later in the plate memory taken out of the exclusive device.

Thus, in the address file processing, the flash memory access layer 64 can be used directly without using the file management processing layer 61, logical address layer 62 and physical address layer 63, and therefore although the file in the FAT file system is used, complicated process of FAT file system is not needed, and the processing time can be shortened. The exclusive device refers to any device having a function of writing the physical address in the plate memory by referring to the physical address table 67 composed of the RAM by using the file system for managing the logical address and physical address of the FAT file system or the like.

In the embodiment, especially in the exclusive device, the physical address table 67 is provided, and by the address file processing unit 65 which starts address file processing realized as a function of the microcomputer when the start key of processing of address file in the operation unit is pressed, immediately referring to the physical address table 67, the physical address on the flash memory corresponding to the logical address of the specified program loader file and ROM data file is acquired, and the physical address of the program loader file and ROM data file is written by accessing the plate memory 7 incorporating the flash memory by the physical address writing processing unit 66 realized as a function of the microcomputer.

In recording and reproducing processing of record data file or reproduction data file, all of the application processing layer 60, file management processing layer 61, logical address layer 62, physical address layer 63, and flash memory access layer 64 are used.

[Structure of physical data] The physical data structure of the flash memory which is a storage element in the plate memory is explained. The storage region in the flash memory consists of segments, which are data units of a fixed length. One segment is a specified size of 4 MB or 8 MB, and the number of segments in one flash memory depends on the capacity of the flash memory.

One segment is divided into blocks, which are data units of a fixed length of 8 KB or 16 KB. In principle, one segment is divided into 512 blocks, and hence block n means n=511. In the flash memory, however, there are a specific number of blocks as defect areas which are flaw areas not to be written in, and the substantial number n of blocks in which data can be written is smaller than 511.

Of the formed blocks 0 to n, the first two blocks 0 and 1 are boot blocks. Actually, however, the first two valid blocks are boot blocks, which are not always blocks 0 and 1. The remaining blocks are user blocks in which user data is stored.

One block is divided into pages 0 to m. The capacity of one page consists of data area of 512 bytes and a redundant area of 16 bytes. The fixed length is 528 (=512+16) bytes. The structure of the redundant area is explained later. The number of pages in one block is 16 in the block with capacity of 8 KB, and 32 in the case of 16 KB.

The page structure in the block is common in the boot block and the user block. In the flash memory, the data is read or written in the page unit, while the data is erased in the block unit. The data can be written only into erased page. Therefore, actual data rewriting or writing is done in the block unit.

In the beginning boot block, a header is stored in page 0, and information showing address as position of initial defect data is stored in page 1. In page 2, information known as CIS/IDI (card information structure/identify drive information) is stored. The second boot block is used as a backup region as boot block.

[Concept of physical address and logical address] With the understanding of the physical data structure in the flash memory mentioned above, the concept of physical address and logical address in the file system of the embodiment is explained below according to the procedure of the data rewriting operation.

Each block is assigned with a physical address. This physical address is determined by the physical array sequence of blocks in the memory, and the relation between a certain block and its corresponding physical address is invariable.

There are used blocks in which block data is stored, and unused blocks in which block data has been erased, that is, unrecorded regions.

The logical address is the address assigned to accompany the data written in the block. This logical address is the address to be used by the FAT file system described below.

In this state, as updating of data stored in the physical address, suppose the content is rewritten or partly erased. In such a case, in the file system of the flash memory, updated data is not written again into the same block, but the updated data is written into an unused block.

In the state before updating of data, the logical address is changed so that the logical address corresponding to the physical address before updating may correspond to the logical address after updating of the block in which the updated data is written.

That is, the physical address is the address specifically given to the block, whereas the logical address accompanies the data once written in the block, that is, it is the address specific to the written data in the block unit.

By such block swapping process, repeated and concentrated accesses to a same storage region of block can be avoided, which can extend the life of the flash memory that is limited in the upper limit of the number of times of rewriting.

At this time, by handling the logical address as mentioned above, if the block to be written in is moved in the data before updating and after updating as a result of the block swapping process, the same address is seen from the FAT, and hence the subsequent access may be executed appropriately.

For the purpose of ease of management for updating on the logical-physical address conversion table described below, the block swapping process is completed within one segment. In other words, block swapping process does not occur between plural segments.

[Logical-physical address conversion table] As understood from the explanation above, by swapping of blocks, the correspondence between the physical address and logical address is changed. Therefore, to realize the access for writing and reading of data in the flash memory, the logical-physical address conversion table showing the correspondence between the physical address and logical address is necessary. That is, the FAT refers to the logical-physical address conversion table, and the physical address corresponding to the logical address designated by the FAT is determined, and it is possible to access the block indicated by this determined physical address. In other words, without the logical-physical address conversion table, the FAT cannot access the flash memory.

A structural example of the logical-physical address conversion table is shown. The logical-physical address conversion table is stored in a certain block designated to be present in the last segment of the flash memory. First, a region of two pages, that is, pages 0 and 1 of the pages composing the block is assigned as a logical-physical address conversion table for segment 0. For example, if the flash memory capacity is 4 MB, there is only one segment, and hence only this region of pages 0 and 1 is a region of the logical-physical address conversion table.

In the case of the flash memory with a capacity of 8 NB, since there are two segments, in addition to pages 0 and 1 assigned as a logical-physical address conversion table for segment 0, the succeeding pages 2 and 3 are assigned as a logical-physical address conversion table for segment 1.

Likewise, as the flash memory capacity is increased, assigning regions of logical-physical address conversion table for each segment are set in every two pages successively. In the case of the maximum capacity of 128 MB, there are 16 segments, and pages for up to segment 15 are assigned as regions for logical-physical address conversion tables. That is, in the flash memory with the maximum capacity of 128 MB, 30 pages are used, and page N is N=29 at maximum. As known from the explanation so far, the logical-physical address conversion tables are managed in every segment.

To show the structure of the logical-physical address conversion table per segment, a data area of two pages is extracted and shown. That is, since the data area of one page is 512 bytes, a total of 1024 bytes (=512×2) are shown.

The relation between the flash memory capacity and size of logical-physical address conversion table is explained. As described above, the size of the logical-physical address conversion table for managing one segment is 1024 bytes corresponding to 2 pages, that is, 1 KB. Therefore, in the flash memory with a capacity of 4 MB having one segment, the size of the logical-physical address conversion table is 1 KB. In the flash memory with a capacity of 8 MB having 2 segments, the size of the logical-physical address conversion table is 2 KB corresponding to 4 pages.

In the flash memory with a capacity of 16 MB, in the case of 2048 blocks=4 segments, the size of the logical-physical address conversion table is 4 KB corresponding to 8 pages, and in the case of 1024 blocks=2 segments, the size of the logical-physical address conversion table is 2 KB corresponding to 4 pages.

In the flash memory with a capacity of 32 MB or 4 segments, the size of the logical-physical address conversion table is 4 KB or 8 pages, in the flash memory with a capacity of 64 MB or 8 segments, the size of the logical-physical address conversion table is 8 KB or 16 pages, and in the flash memory with a maximum capacity of 128 MB or 16 segments, the size of the logical-physical address conversion table is 16 KB or 32 pages.

Figure 2:
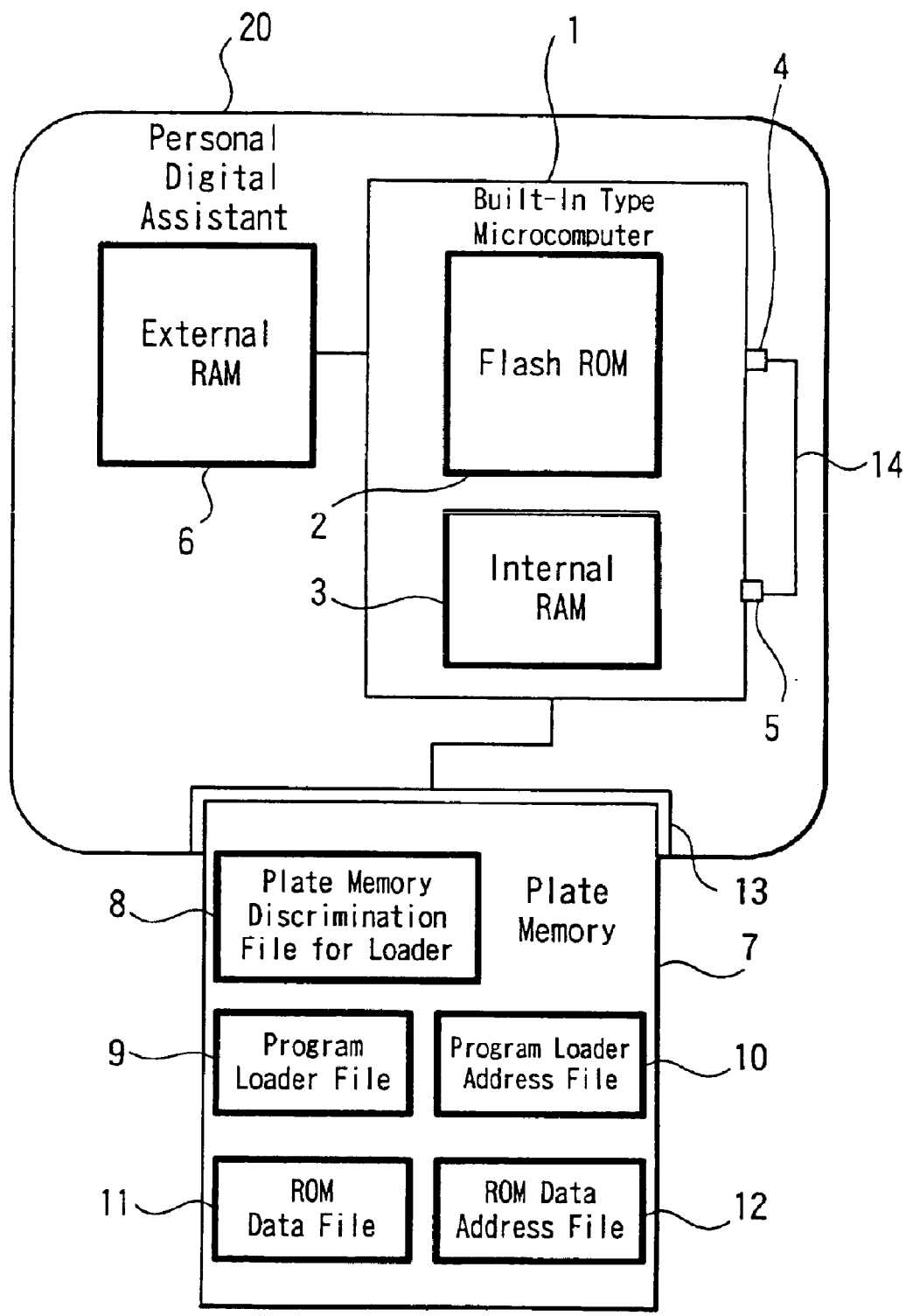
FIG. 2 is a diagram showing the composition of a personal digital assistant and plate memory according to the embodiment.

[Structure of personal digital assistant and plate memory] Referring next to FIG. 2, the structure of the personal digital assistant and the plate memory is explained. FIG. 2 shows the structure of the main body of the personal digital assistant capable of reading, writing, and editing data in the plate memory as explained above. The file storage system is composed of the set main body 20 and the plate memory 7 shown in the diagram.

The set main body 20 can handle many types of data to be written read in the plate memory 7, including, for example, moving image data, still image data, voice data, other audio data, high quality audio data as reproduced from CD (compact disc), MD (mini disc) or TM, and control data.

To simplify the explanation, the system of storing and reproducing speech data is explained, but it can be also used as the storage system of moving image and other data file by installing the input and output system and processing system for moving image, still image, audio data, etc., in the set main body 20.

The set main body 20 comprises a detachable mechanism 13 for mounting this detachable set main body 20, and the data is exchanged between the plate memory 7 loaded in this detachable mechanism 13 and the built-in microcomputer for control by way of a host interface IC not shown in the drawing.

The set main body 20 also comprises a microphone not shown in the drawing, and the audio signal of speech or diction collected by the microphone is supplied into the DSP (digital signal processor) as audio signal through a microphone amplifier. In the DSP, this entered audio signal is converted into digital audio data, and processed by encoding and other operation, and is supplied into the microcomputer 1 as recorded data. The microcomputer 1 executes the process of storing this recorded data into the plate memory 7 through the host interface IC.

The microcomputer 1 also reads out the audio data stored in the plate memory 7 through the host interface IC, and supplies this read-out data into the DSP. In the DSP, the supplied data is demodulated and processed, and is finally sent out into the speaker amplifier as analog audio signal. In the speaker amplifier, the entered audio signal is amplified, and is delivered to the speaker. As a result, the reproduced audio is delivered.

Further, the microcomputer 1, by controlling the display driver, displays a desired image in the display unit. For example, the menu or guide display for assisting the user's operation, or the file content stored in the plate memory 7 is displayed. Or, when image data of moving image or still image is stored in the plate memory 7, the image data is read out, and displayed in the display unit.

In the embodiment, the microcomputer 1 comprises a flash ROM 2 for storing the ROM data file which stores program data for control, an internal RAM 3 for storing the program loader file which stores the rewrite program for executing rewriting of control data and program data, a write enable terminal 4 for controlling the rewrite function of the program data stored in the flash ROM 2 in disable state or enable state, an output terminal 5, and a jumper wire 14 used in transmission of control signal of disable state or permit state of the rewrite function of program data by connecting the write enable terminal 4 and output terminal 5. Further, the microcomputer 1 also comprises an external RAM 6 for temporarily storing the program loader file which stores the rewrite program for executing rewriting of program data.

Thus, the microcomputer 1 having the rewrite function of the flash ROM 2 has the write enable terminal 4 for controlling whether or not to rewrite the flash ROM 2 as the function of the hardware. The output terminal 5 of the microcomputer for controlling this write enable terminal 4 is connected by the jumper wire 14, and usually the write enable terminal 14 is controlled in the write disable state. Herein, the function of controlling the write enable terminal 4 in the write enable state through the jumper wire 14 from the output terminal 5 and enabling to rewrite the flash ROM 2 is not present in the ROM data of the flash ROM 2 of the set main body 20 side in the initial state.

In the embodiment, considering the safety of preventing accidental rewriting or erasing of program data, the function of controlling the write enable terminal 4 in the write enable state through the jumper wire 14 preliminarily wired to, for example, the print pattern of the printed circuit board from the output terminal 5 and enabling to rewrite the flash ROM 2 is provided in the program loader composed of the software module stored in the plate memory 7. Only when this program loader is read into the internal RAM 3 of the microcomputer 1, the write disable state of the write enable terminal 4 is cleared and controlled in the write enable state, and by this program loader, a new ROM data file is written into the flash ROM 2, so that the ROM data can be rewritten.

At the plate memory 7 side, a program loader file 9 storing the rewrite program for executing rewriting of program data, and a ROM data file 11 storing new program data for control are stored.

Further, the plate memory 7 of the embodiment connected to the personal digital assistant 20 through the detachable mechanism 13 includes a plate memory discrimination file for loader 8 for discriminating whether this plate memory 7 has stored or not the program loader file 9 which is an official program for rewriting program data and the ROM data file 11.

Thus, since the plate memory discrimination file for loader 8 is provided in the plate memory 7, and the program loader file 9 is provided at the plate memory 7 side, not at the set main body 20 side, it is possible to prevent a rewrite and destruction of the ROM data by unexpected operation such as runaway of the microcomputer 1 due to unstable power supply in the personal digital assistant 20.

In the embodiment, the plate memory 7 holds a program loader address file 10 storing the address of the program loader file 9, and a ROM data address file 12 storing the address of the ROM data file 11.

Herein, the physical addresses of the program loader address file 10 and ROM data address file 12 are written in as follows. As explained in FIG. 1, in the exclusive device, the physical address conversion table 67 is provided, for example, on the RAM, and by the address file processing unit 65 realized as a function of the microcomputer for starting address file processing when the start key of processing of address file in the operation unit is pressed, immediately referring to the physical address table 67, the physical address on the flash memory corresponding to the logical address of the specified program loader file and ROM data file is acquired, and the physical address of the program loader file and ROM data file is written by accessing the plate memory 7 by the physical address writing processing unit 66 realized as a function of the microcomputer.

In the operation unit not shown in the drawing, various keys are provided to be used by the user for various operations of the set main body 20. The microcomputer 1 receives a command corresponding to the operation done in this operation unit, and executes the specified control process corresponding to the command. Operations include the ROM data rewrite instruction, file storage instruction, file selection instruction, file reproduction instruction, and edit instruction.

The structure of the set main body 20 shown in FIG. 2 is only an example, and is not limitative. That is, as far as the data can be transmitted and received with the plate memory 7, any type of electronic appliance may be used.

Figure 3:
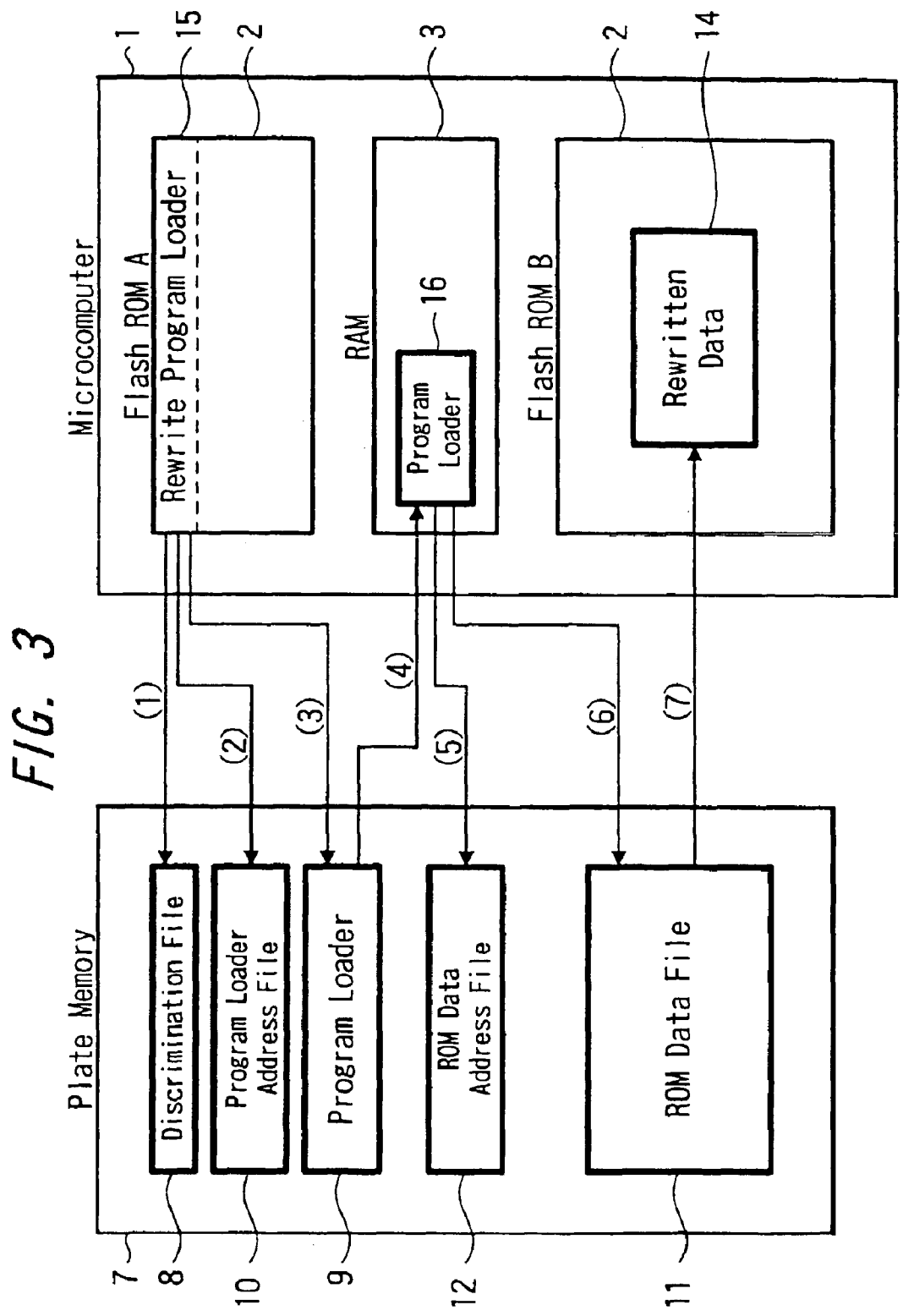
FIG. 3 is a data flow diagram between a microcomputer and plate memory according to the embodiment.

Referring now to FIG. 3, an outline of operation is explained. Of the parts shown in FIG. 3, those same as in FIG. 1 and FIG. 2 are identified with same reference numerals.

The microcomputer 1 comprises a flash ROM 2 and a RAM 3, and in FIG. 3, in order to explain as a functional block, the flash ROM 2 is divided into a flash ROM A and a flash ROM B. It is not required to be separated physically, but, for example, a same flash ROM may be used by dividing by the block address.

In the plate memory 7, same as in the block shown in FIG. 2, a discrimination file 8, a program loader address file 10, a program loader file 9, a ROM data address file 12, and a ROM data file 11 are stored.

In the initial state, the control program before addition of function is stored in the flash ROM of the microcomputer 1, and the data using the control program before addition of function is stored in the RAM 3.

The flash ROM A of the microcomputer 1 stores the program loader address file as a program for judging whether the program stored in the plate memory 7 for rewriting the control program before addition of function stored in the flash ROM B is stored or not, and for rewriting, and a rewrite program loader 15 as the program for loading the program loader.

The personal digital assistant 20 has the plate memory 7 which stores the discrimination file 8, program loader address file 10, program loader file 9, ROM data address file 12, and ROM data file 11, and the rewrite program loader 15 stored in the flash ROM A is executed when an update instruction of program is entered. The rewrite program loader 15 searches the discrimination file 8 while accessing the plate memory 7 by the physical address as shown in (1). When the discrimination file 8 is detected, it is judged that the data and data rewrite program for updating the control program stored in the flash ROM provided in the microcomputer 1 of the personal digital assistant 20 is stored in the plate memory 7 presently provided in the personal digital assistant 20.

When the discrimination file 8 is detected, the rewrite program loader 15 searches the program loader address file 10 by accessing the inside of the plate memory 7 by the physical address as shown in (2). When the program loader address file 10 is detected, the rewrite program loader 15 designates the stored position of the program loader 9 stored in the plate memory 9 on the basis of the program loader address file 10 as shown in (3), and from the address designated as in (4), the program loader 9 is loaded into the RAM 3 provided in the microcomputer 1.

After all program loaders 9 are loaded in the RAM 3, the rewrite program loader 15 transfers the control to the program loader 16 developed on the RAM 3. More specifically, the microcomputer 1 executes the instruction for jumping to the execution start address of the program loader 16 so that the program may be executed by the microcomputer 1 from the execution start address of the program loader 16 developed on the RAM 3.

The program loader 16 on the RAM 3 having the execution control right searches the ROM address file by accessing the plate memory 7 by the physical address as shown in (5).

The program loader 16 on the RAM 3, when the ROM data address file 12 is detected, accesses the ROM data file 11 from the plate memory 7 according to the detected ROM data address file 12, and writes the rewrite data to be read into the flash ROM B while erasing the region in which the program to be updated of the flash ROM B of the microcomputer 1 has been recorded.

Of the ROM data files 11 stored in the plate memory 7, when necessary data is all written into the flash ROM B of the microcomputer 1, the program loader 16 stored in the RAM 3 executes, for example, a RESET instruction so that the microcomputer operates to initialize, and the microcomputer 1 is controlled so as to operate the program for controlling the personal digital assistant 20 recorded in the flash ROM 2.

The microcomputer 1, by executing the initialize program, erases the program loader 16 stored on the RAM 3, thereby returning to the ordinary processing operation.

Figure 4:
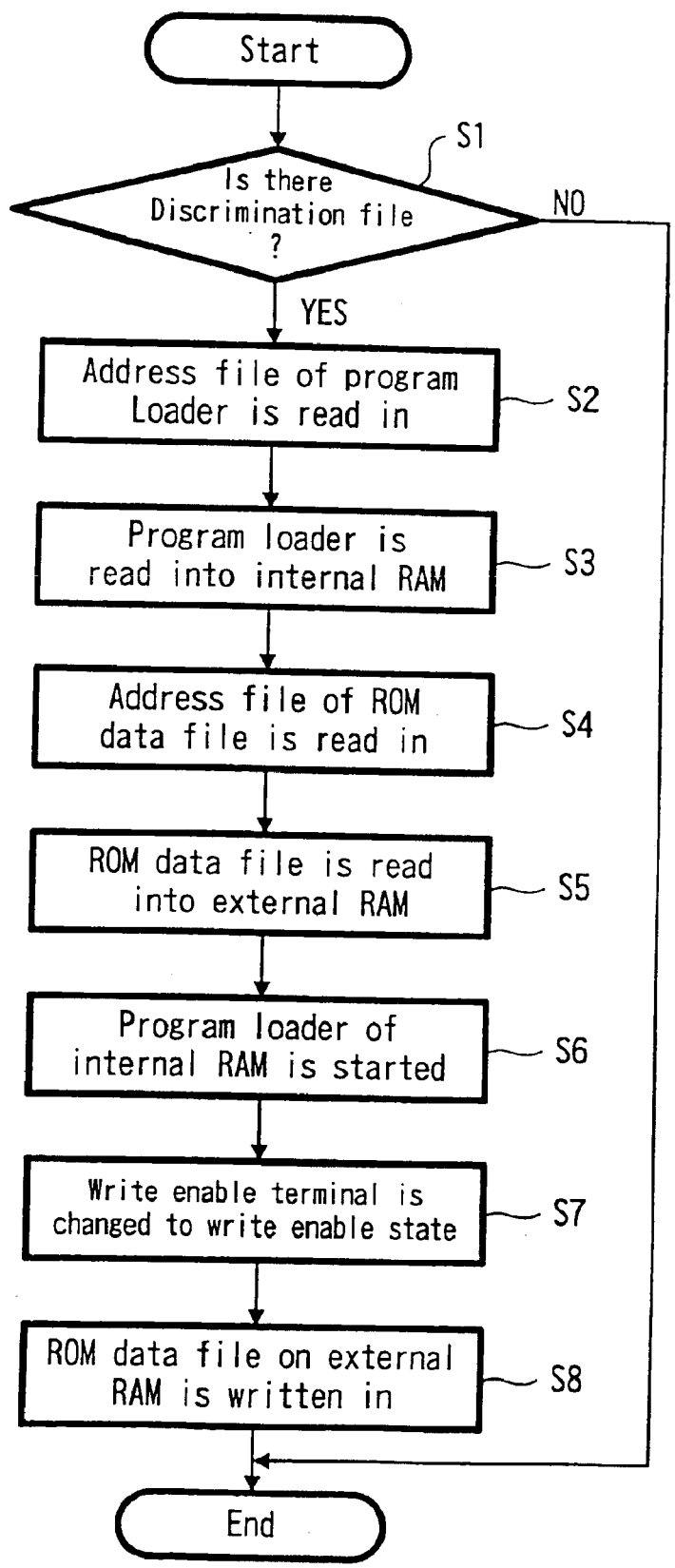
FIG. 4 is a flowchart showing flash ROM rewriting operation according to the embodiment.

[Flowchart of flash ROM rewrite operation] The operation of the embodiment is explained by referring to the flowchart of flash ROM rewrite operation in FIG. 4. In FIG. 4, in the personal digital assistant 20 controlled in write disable state of ROM data shown in FIG. 2, the ROM data is rewritten by using the program data file 9 and ROM data file 11 stored in the plate memory 7.

In FIG. 4, starting the flash ROM rewrite process, at step S1, the microcomputer 1 judges if the plate memory discrimination file for loader 8 is stored or not in the plate memory 7 connected in the main body of the personal digital assistant. Specifically, the microcomputer 1 detects whether the plate memory discrimination file for loader 8 has the header as the identifier for discriminating whether or not this plate memory has stored the official program loader file 9 for rewriting the program loader and the ROM data file 11.

Figure 6:
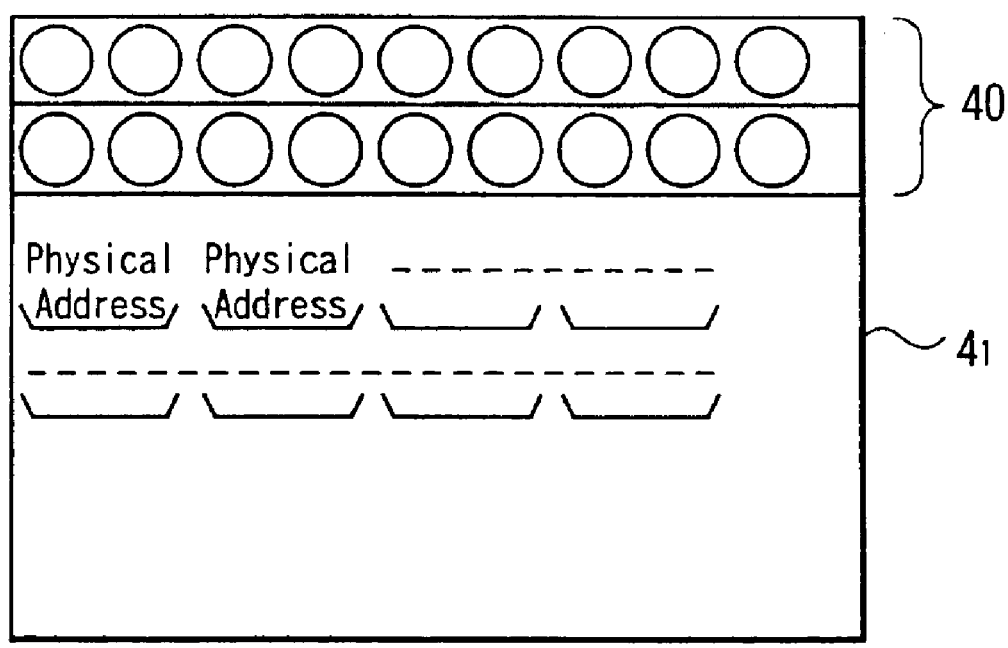
FIG. 6 is a diagram showing the composition of physical address file according to the embodiment.

The composition of the physical address file is shown in FIG. 6. In FIG. 6, the access for writing, reading or erasing in the flash memory by the physical address is executed as follows. First, the block is searched from the beginning in the sequence of physical addresses until finding a correct header 40 for accessing for writing, reading or erasing. Next, when the correct header 40 is searched in the first process, the corresponding physical address 41 is acquired. Thus, the desired physical address is accessed.

FIG. 7A, FIG. 7B, and FIG. 7C show examples of header data of discrimination file. The loading method of program loader file 9 and ROM data file 11 includes a method of connecting a personal computer to the main body of the personal digital assistant through an interface and loading from the personal computer, and a method of connecting the plate memory to the main body of the personal digital assistant and loading from the plate memory.

In FIG. 7A, when loading from the personal computer, as the discrimination data 50, ABC DEF MEMSTICK PROGRAM LOADER LOAD FROM PC is stored, and after a space 51, "32" is entered as the number of pages 52 indicating the storage region per block.

In FIG. 7B, when loading from the plate memory, as the discrimination data 53, ABC DEF MEMSTICK PROGRAM LOADER LOAD FROM MS is stored, and after a space 54, "16" is entered as the number of pages 55 indicating the storage region per block.

Detecting the header data as such identifier, when it is recognized by the microcomputer that it is the plate memory in which official ROM data is recorded, the operation goes to step S2.

Then, at step S2, the microcomputer 1 reads in the program loader file 10 which is an address file of the program loader as the software module. Specifically, as explained in FIG. 1, in the exclusive device, the physical address table 67 is provided on the RAM, and by the address file processing unit 65 realized as a function of the microcomputer 1 for starting address file processing when the start key of processing of address file in the operation unit is pressed, immediately referring to the physical address table 67, the physical address on the flash memory corresponding to the logical address of the specified program loader file is acquired, and the physical address of the program loader file is written by accessing the plate memory 7 by the physical address writing processing unit 66 realized as a function of the microcomputer 1. By reading in this program loader address file 10, the microcomputer 1 of the personal digital assistant 20 is not required to interpret the huge program such as FAT.

At step S3, the microcomputer 1 reads the program loader file 9 storing the program loader as software module, into the internal RAM 3. Specifically, using the physical address data of the program loader address file 10, the microcomputer 1 accesses the storage region of the plate memory 7, and reds out the program loader file 9 storing the program loader as software module, and writes it into the specified region on the internal RAM 3.

FIG. 7C shows an example of header data of the program loader file. In FIG. 7C, as the discrimination data 56, ABC DEF MEMSTICK PROGRAM LOADER is stored, and as the file name 57, romdata.dat is stored, and after a space 58, 0x00A3, 0x003F, 0xFFF are stored as the physical block address data 59.

At step S4, the microcomputer 1 reads in the ROM data address file 12 which is an address file of the ROM data file. Specifically, as explained in FIG. 1, in the exclusive device, the physical address conversion table 67 is provided on the RAM, and by the address file processing unit 65 realized as a function of the microcomputer 1 for starting address file processing when the start key of processing of address file in the operation unit is pressed, immediately referring to the physical address table 67 on the RAM, the physical address on the flash memory corresponding to the logical address of the specified ROM data file is acquired, and the physical address of the ROM data address file is written by accessing the plate memory 7 by the physical address writing processing unit 66 realized as a function of the microcomputer 1. By reading in this ROM data address file 12, the microcomputer 1 of the personal digital assistant 20 is not required to interpret the huge program such as FAT.

Since the program loader file 9 and program loader address file 10 are recorded on the FAT file system, it is easy to write into the personal digital assistant 20 from the personal computer. At step S5, the microcomputer 1 writes the ROM data file 11 storing the ROM data into the external RAM 6. Specifically, using the physical address of the ROM data file 11, the microcomputer 11 accesses the storage region of the plate memory 7, and reads out the ROM data file 11 storing the ROM data, and writes into the specified region on the external RAM 6.

FIG. 7C shows an example of header data of the ROM data file. In FIG. 7C, as the discrimination data 56, ABC DEF MEMSTICK PROGRAM LOADER is stored, and as the file name 57, romdata.dat is stored, and after a space 58, 0x00A3, 0x003F, 0xFFFF are stored as the physical block address data 59.

At step S6, the microcomputer 1 starts the program loader on the internal RAM. Specifically, the microcomputer 1 starts the program loader stored in the internal RAM, controls the output terminal 5, and issues a control signal for controlling the write enable terminal 4 into a rewrite enable state through the jumper wire 14 from the output terminal 5.

At step S7, the microcomputer 1 changes the write enable terminal 4 into a write enable state. Specifically, the microcomputer 1 controls the output terminal 5 so that the written enable terminal 4 may be set in rewrite enable state on the basis of the control signal issued from the output terminal 5.

In this way, the function for enabling to rewrite the flash ROM 2 is provided in the program loader composed of the software module stored in the plate memory 7, and only when this program loader is read into the internal RAM 3 of the microcomputer 1, the write disable state of the write enable terminal 4 is cleared and controlled to be in write enable state.

At step S8, the microcomputer 1 write the ROM data file on the external RAM. Specifically, the microcomputer 1 writes the ROM data stored in the external RAM 6 into the flash ROM 2.

Thus, the ROM data is rewritten by writing a new ROM data file into the flash ROM 2.

Figure 5:
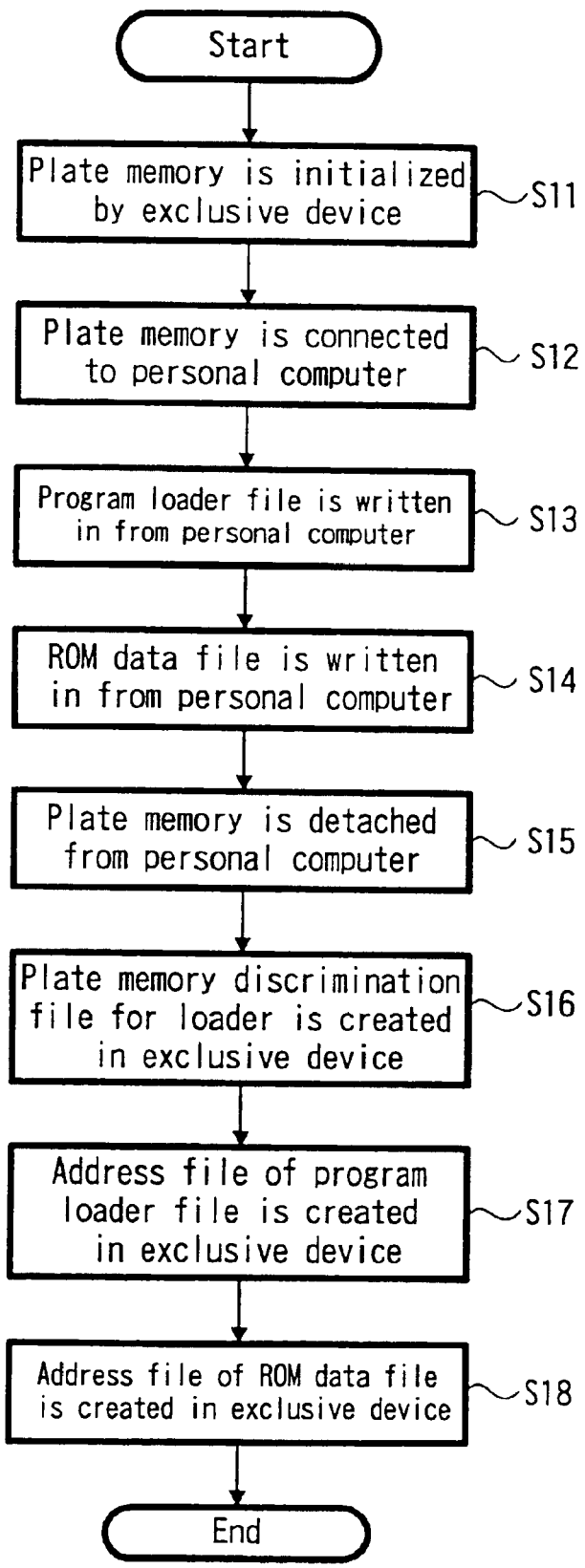
FIG. 5 is a flowchart showing creating operation of necessary data according to the embodiment.

[Flowchart of necessary data creation operation] The operation of the embodiment is explained next by referring to the flowchart of necessary data creation operation in FIG. 5. FIG. 5 is an explanation of creation of plate memory discrimination file for loader 8, program loader file 9, ROM data file 11, program loader address file 10, and ROM data address file 12 stored in the plate memory 7 shown in FIG. 2 by means of an external device such as exclusive device or personal computer.

In FIG. 5, starting data creation process, at step S11, the plate memory is initialized by the exclusive device. Specifically, the plate memory is connected to the exclusive device capable of formatting into a file system such as FAT to initialize so as to erase unnecessary data.

At step S12, the plate memory is connected to the personal computer. Specifically, the plate memory is connected to the personal computer through a specified interface.

At step S13, the program loader file is written in from the personal computer. Specifically, by formatting the plate memory by the exclusive device for file system such as FAT, the program loader file preliminarily created on the personal computer can be recorded into the FAT file system, so that the program loader file can be easily written into the plate memory 7 from the personal computer.

FIG. 7C shows an example of header data of the program loader file. In FIG. 7C, as the discrimination data 56, ABC DEF MEMSTICK PROGRAM LOADER is stored, and as the file name 57, romdata.dat is stored, and after a space 58, 0x00A3, 0x003F, 0xFFFF are stored as the physical block address data 59.

At step S14, the ROM data file is written in from the personal computer. Specifically, by formatting the plate memory by the exclusive device for file system such as FAT, the ROM data file preliminarily created on the personal computer can be recorded into the FAT file system, so that the ROM data file can be easily written into the plate memory 7 from the personal computer.

FIG. 7C shows an example of header data of the ROM data file. In FIG. 7C, as the discrimination data 56, ABC DEF MEMSTICK PROGRAM LOADER is stored, and as the file name 57, romdata.dat is stored, and after a space 58, 0x00A3, 0x003F, 0xFFFF are stored as the physical block address data 59.

At step S15, the plate memory is removed from the personal computer. Specifically, by detaching the plate memory from the specified interface, it is removed from the personal computer.

At step S16, the plate memory discrimination file for loader is created by the exclusive device. Specifically, in the composition of the physical address file shown in FIG. 6, at the position of the header 40, as the header data of discrimination file shown in FIG. 7A, for example, ABC DEF MEMSTICK PROGRAM LOADER LOAD FROM PC is stored as the discrimination data 50 when loading from the personal computer, and after a space 51, "32" is entered as the number of pages 52 indicating the storage region per block. In FIG. 7B, further, when loading from the plate memory, ABC DEF MEMSTICK PROGRAM LOADER LOAD FROM MS is stored as the discrimination data 53, and after a space 54, "16" is entered as the number of pages 55 indicating the storage region per block.

At step S17, the address file of program loader file is created in the exclusive device. Specifically, as explained in FIG. 1, in the exclusive device, the physical address table 67 is provided, for example, in the RAM, and by the address file processing unit 65 realized by the function of the microcomputer 1 for starting the address file processing when the start key of processing of address file in the operation unit is pressed, immediately referring to the physical address table 67, the physical address on the flash memory corresponding to the logical address of the specified program loader file is acquired, and the physical address of the program loader file is written by accessing the plate memory 7 by the physical address writing processing unit 66 realized by the function of the microcomputer 1.

At step S18, the address file of ROM data file is created in the exclusive device. Specifically, as explained in FIG. 1, in the exclusive device, the physical address table 67 is provided, for example, in the RAM, and by the address file processing unit 65 realized by the function of the microcomputer 1 for starting the address file processing when the start key of processing of address file in the operation unit is pressed, immediately referring to the physical address table 67, the physical address on the flash memory corresponding to the logical address of the specified ROM data file is acquired, and the physical address of the ROM data file is written by accessing the plate memory 7 by the physical address writing processing unit 66 realized by the function of the microcomputer 1.

Figure 8:
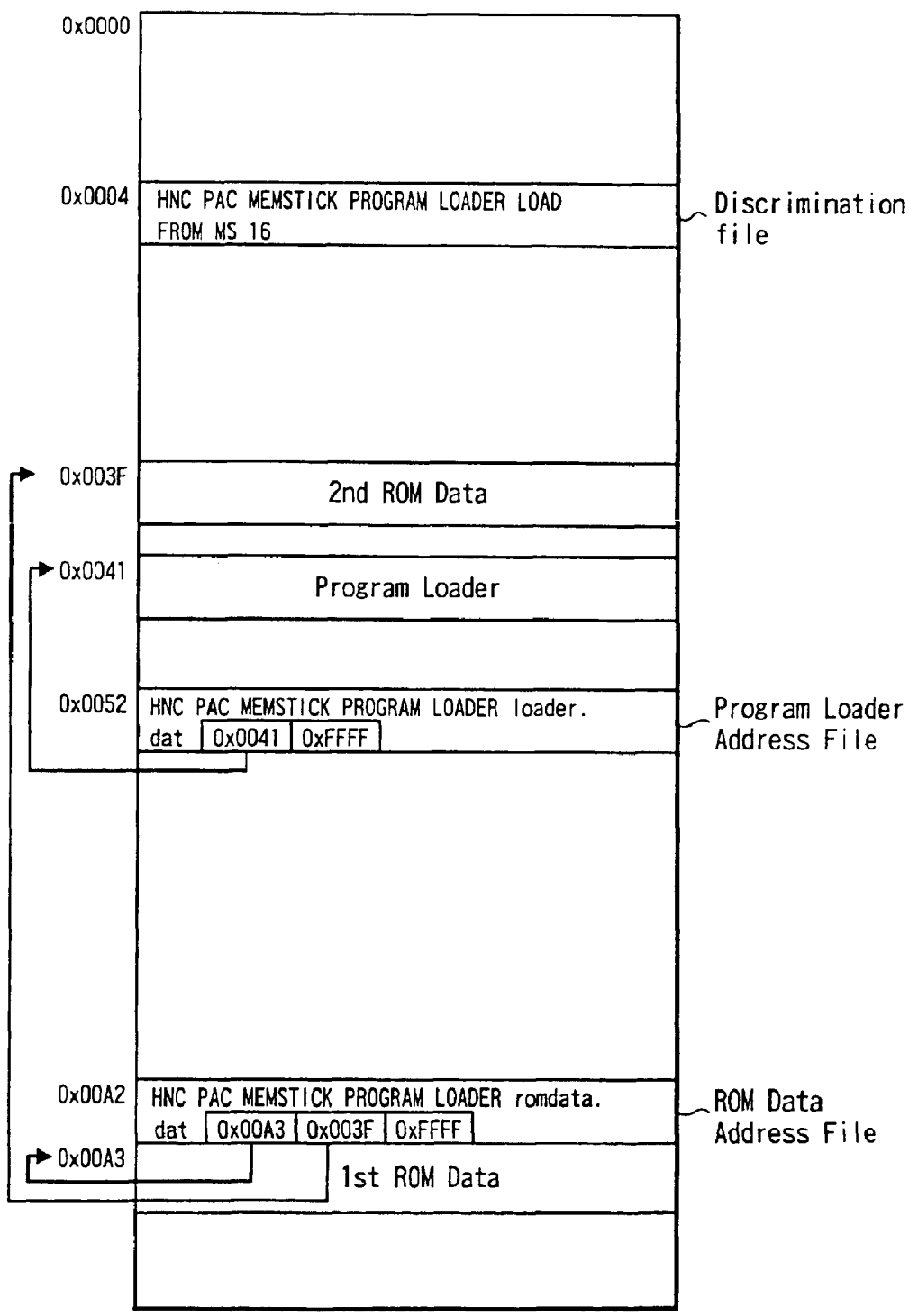
FIG. 8 is a diagram showing the storage state of the data in the plate memory in which the program for rewriting the flash ROM is stored according to the embodiment.

Referring now to FIG. 8, the operation of rewriting the program stored in the flash ROM 2 incorporated in the microcomputer 1 in FIG. 2 is explained.

FIG. 8 shows the data stored in the internal ROM of the plate memory 7 assigned with the physical block address.

In the physical block address 0x0004 in FIG. 8, the discrimination file in FIG. 7B is recorded. This is the plate memory discrimination file for loader stored in the plate memory 7 in FIG. 2.

In the physical block address 0x0052 in FIG. 8, the ROM data address file in FIG. 7C is recorded. This is the ROM data address file 12 stored in the plate memory 7 in FIG. 2.

In the physical block address 0x00A2 in FIG. 8, the program loader address file in FIG. 7D is recorded. This is the program loader address file 10 stored in the plate memory 7 in FIG. 2.

In the physical block address 0x0041 in FIG. 8, there is the program loader file 9 recorded in the plate memory 7 in FIG. 2.

The data stored in the physical block addresses 0x00A3 and 0x003F in FIG. 8 are the data for composing the ROM data file 11 stored in the plate memory 7 in FIG. 2.

When rewriting the program stored in the flash ROM 2 incorporated in the microcomputer 1 provided in the personal digital assistant 20, first, the program for preparing program rewrite stored in the flash ROM 2 is stated.

This program for preparing program rewrite accesses the plate memory 7 shown in FIG. 8 by instructing sequentially from the beginning address by the physical block address, and judges if there is a header indicating the plate memory discrimination file for loader 8 as shown in FIG. 7B or not at the specified position of the data being read out from the block instructed by the physical block address.

When the data is recorded as shown in FIG. 8, if the physical block address 0x0004 is read out, it is judged that the program and data for rewriting the program stored in the flash ROM 2 incorporated in the microcomputer 1 provided in the personal digital assistant 20 are recorded in the installed plate memory. That is, when reading out the block of physical block address 0x004, a character string ABC DEF MEMSTICK PROGRAM LOAD FROM MS is recognized, and therefore it is judged that the program loader file or ROM data file is recorded in the installed plate memory.

When it is judged that the plate memory discrimination file for loader 8 is recorded in the installed plate memory, successively, the program loader address file 10 and ROM data address file 12 are detected from within the plate memory.

Specifically, reading out the blocks sequentially from the physical block address 0x0000, if the program loader address file 10 is found, the block corresponding to FIG. 7D in which a character string ABC DEF MEMSTICK PROGRAM LOADER loader.dat is recorded is searched. In the case of the ROM data address file 12, the block corresponding to FIG. 7C in which a character string ABC DEF MEMSTICK PROGRAM LOADER romdata.dat is recorded is searched.

If the data is recorded as shown in FIG. 8, at the physical block address 0x0052, the program loader address file is detected, and at the physical block address 0x00A2, the ROM data address file is detected.

When the program loader address file 10 is detected, the microcomputer 1 reads out the physical address in which the program for rewriting the flash ROM 2 recorded in the plate memory 7, from the program loader address file 10. In the case of FIG. 8, first 0x0041 is read out from the position of the physical block address data 73 in FIG. 7D.

The microcomputer 1 reads out the program loader file from the block of 0x0041 of the plate memory 7 according to the physical block address 0x0041, and stores it in the internal RAM 3. To judge if the program loader file continuing from the program loader address file 10 to the block of 0x0041 is recorded in the plate memory 7 or not, the next physical block address is read out from the position of the physical block address data 73 in FIG. 7D. In this example, since the data to be read out next is 0xFFFF, it is judged there is no program loader file continuing from the physical block address 0x0041.

Consequently, the microcomputer 1 reads out the physical block address 59 in FIG. 7C from the detected ROM data address file, and 0x00A3 is read out as the first physical block address. On the basis of the physical block address 0x000A3 being read out, the microcomputer 1 reads out 1st ROM Data from the block of the physical block address 0x00A3 of the plate memory 7, and stores it in the external RAM 6 provided in the personal digital assistant 20. In succession, the microcomputer 1 reads out 0x003F as the second physical block address from the physical block address data 59 of the ROM data address file in FIG. 7C. On the basis of the physical block address 0x003F being read out, the microcomputer 1 reads out one block of 2nd ROM Data from the physical block address 0x003F of the plate memory 7, and stores it in the external RAM 6. Further, the microcomputer 1 reads out the terminal end data 0xFFFF as the next physical address from the physical block address data 59 of the ROM data address file in FIG. 7C, and recognizes that there is no further ROM data, and terminates the reading process of ROM data.

When the program loader file 9 and ROM data file 11 are stored in the internal RAM 3 and external RAM 6, respectively, the program for rewriting the program stored in the flash ROM 2 transfers the control right to the program loader file stored in the internal RAM 3 so as to operate the program loader file stored in the internal RAM 3. Specifically, it is instructed to the microcomputer 1 to jump to the execution start position of the program loader stored in the internal RAM 3.

The program loader stored in the internal RAM 3 provided with the execution control right is programmed so as to control the output terminal 5 of the microcomputer 1, and controls the output terminal 5 so that the write enable terminal 4 may be set in write enable state of the flash ROM 2 through the jumper wire 14.

In succession, the program loader stored in the internal RAM 3 erases at least the region storing the data for replacing the data stored in the flash ROM stored in the external RAM 6, and writes the data stored in the external RAM 6 into the specified block in the flash ROM 2. After completion of writing, controlling the output terminal 5, the write enable terminal 4 is set in a write disable state of the flash ROM 2, and then the boot loader transfers the control right to the program stored in the flash ROM 2, and the rewriting process of the flash ROM 2 is terminated. Specifically, it is executed by jumping to the address for starting execution in the initial state of the program stored in the flash ROM 2.

Referring to the file system processing hierarchy in FIG. 1, this is to explain the procedure of acquiring the physical address of the program loader file and ROM data file at step S17 and step S18 in the flowchart in FIG. 5.

In FIG. 1, first, the beginning cluster number is obtained from the directory of the application processing layer 60 and the continuous cluster numbers from the FAT, in the address file processing unit 65. Second, the cluster numbers obtained in the first process are converted into physical addresses by referring to the physical address table 67. As a result, the physical addresses of the desired program loader file and ROM data file can be obtained. Thus, the physical address is calculated from the cluster number of logical address.

[Structure of FAT] As explained in the file system hierarchy in FIG. 1, the file management process is executed by the FAT. That is, by the personal digital assistant 20 having the structure as shown in FIG. 2, to realize recording and reproducing of data, that is, writing and reading, in the plate memory 7, the FAT refers to the file storage position management according to the request in the application process, and further the actual access is executed by logical-physical address conversion. Herein, the structure of the FAT is explained.

An outline of management structure by the FAT is shown. In this embodiment, the FAT and logical-physical address conversion table are stored in the plate memory 15, and the FAT structure is the management structure in the plate memory.

The FAT management structure consists of partition table, empty region, boot sector, FAT, FAT copy, route directory, and data region. In the data region, the unit data is shown as cluster 2, cluster 3, and so forth, and the cluster is the management unit, or one data unit handled in the FAT. Generally, in the FAT, the standard cluster size is 4 k bytes, but the cluster size may be specified somewhere between 512 bytes and 32 k bytes in the magnitude of the power of 2.

In the plate memory of the invention, one block is 8 k bytes or 16 k bytes, and in the case of the plate memory 15 of 1 block=8 k bytes, the cluster handled in the FAT is 8 k bytes. In the case of the plate memory 1 of 1 block=16 k bytes, the cluster handled in the FAT is 16 k bytes. That is, 8 k bytes or 16 k bytes is the data unit on the FAT management, and is also one data unit as block in the plate memory. Therefore, from the viewpoint of the late memory, the cluster size handled in the FAT is the block size of the plate memory. In the following explanation of the embodiment, for the sake of simplicity, it is assumed block=cluster.

The block numbers are indicated as x, . . . , (x+m−1), (x+m), (x+m+1), (x+m+2), . . . , and in each block, various data composing the FAT structure are stored. Actually, however, the information is not always stored in the physically continuous blocks.

In the FAT structure, first in the partition table, the beginning and end addresses of the FAT partition of maximum 2G bytes are described. In the boot region, the distinction of so-called 12-bit FAT and 16-bit FAT, and size, cluster size, and region size as FAT structure are described.

The FAT is the table showing the link structure of the clusters for composing each file as mentioned below, and a copy of the FAT is described in the succeeding region. In the route directory, the file name, beginning cluster number and attributes are described. For these descriptions, 32 bytes is used for one file.

[File structure of plate memory] [Composition of directory] The file structure to be stored in the plate memory is explained. An example of directory composition is shown in the first place. As mentioned earlier, the main data to be handled in the plate memory include moving image data, still image data, audio data, music data or high quality audio data reproduced from CD or MD, and control data, and hence as the directory composition, from the route directory, VOICE (directory for speech), DCIM (directory for still image), MOxxxxnn (directory for moving image), AVCTL (directory for control), and HIFI (directory for music) are distributed.

In particular, the file of audio data is explained below. As sub-directory files of directory VOICE, order file (ORDER.MSF), additional information management file (INFO.MSF), folder (FOLDER1, FOLDER2, . . . ) and others are formed. In the folder, for example, a speech data file (file name 98120100.MSV) of actual audio data is formed.

[Speech data file] A data structure of speech data file is shown. The speech data file comprises format frame, TOC frame, title frame, maker frame, author frame, space frame, and data frame. Among them, the title frame, maker frame and author frame are arbitrary, and basically the speech data file is composed of format frame, TOC frame, space frame, and data frame.

The format frame is the basic management information of speech data file, and types of CODEC are shown. The TOC frame is the management information showing the array state of each frame of the speech data file. That is, by the description of the TOC frame, the frame structure of the speech data file is identified. The data frame is a region in which actual speech data is stored. The speech frame is, as described in detail later, an unused area, and it functions as a reserve region when extending the TOC frame or is used for setting reproduction disable area in the file.

Of these frames, the data frame and space frame may exist in a plurality within a same file. However, other frames than the data frame and space frame are allowed by only one in a same file. The format frame is always positioned at the beginning of the file. The TOC frame comes right after the format frame. Other arbitrary frames (title frame, maker frame, and author frame) are put together after the TOC frame. These frames are arranged from the smaller ID number. These arbitrary frames are followed immediately by the space frame.

In divide processing of speech data file, in the cluster including the division point, the data area which is not reproduced is a space frame. That is, when a division point is set at an intermediate position of the cluster, in the latter file after the division, the beginning of the speech data is the division point of the cluster. Since the minimum unit of the file is always a cluster, the data before the division point in the cluster includes the data that cannot be reproduced, but this portion is included in the space frame so as not to be reproduced.

As a result of divide and couple process of speech data file, two space frames may be adjacent to each other. In such a case, two adjacent space frames are assembled into one space frame. That is, they are managed as one space frame in the TOC frame.

Herein, as the embodiment, the personal digital assistant, plate memory, and flash ROM rewriting operation by using them are described, but the invention is not limited to such structure and operation alone. In particular, in the system using the plate memory, examples are about rewriting process of ROM data for writing, reading or erasing the audio data file or voice data file handling audio data or voice data as main data, but in this plate memory system, as mentioned above, aside from the voice data file, music data file or other audio data file, moving image data file or other image data file can be also handled. In such audio data file or video data file, by rewriting the ROM data same as mentioned above, the operation of the microcomputer in the personal digital assistant 20 can be stabilized.

In this way, by using the FAT file system as file system, and using the flash memory through the detachable mechanism as the recording medium, in the personal digital assistant having the microcomputer capable of rewriting the ROM data by the function of recording or reproducing the stream data such as audio data of speech and music, the ROM data can be rewritten without disassembling the microcomputer, and the operation of the microcomputer in the personal digital assistant 20 can be stabilized, so that the controllability and maintainability when updating or repairing the ROM data can be enhanced.

In the foregoing description, the FAT or FAT file system refers to the file management system in the nonvolatile memory for composing the plate memory. The recording medium used in the personal digital assistant in the embodiment is not limited to the plate memory as shown in FIG. 2, but includes the solid memory media of different shapes, such as memory chip, memory card, memory module, MultiMediaCard (MMC) proposed by Toshiba, Matsushita, SanDisk, Hitachi, Motorola, NEC and Nokia, SD (Secure Digital) Memory Card proposed by Toshiba, Matsushita and SanDisk, or PC card. The format of the file system explained so far is not limited to the FAT file system, but other file systems may be also used, or the specification of the detail may be changed or modified as required. Variations of the capacity of the flash memory are not limited to the mentioned examples. Of course, the memory element of the storage medium of the embodiment is not limited to the flash memory, but other memory elements or programmable compact discs may be used.

All functions for rewriting the flash ROM 2 which is the nonvolatile memory in the invention may not be supplied from the plate memory 7 only, but only part of the functions for rewriting the flash ROM 2 may be supplied from the plate memory 7.

The personal digital assistant of the invention comprises a recording medium detachably provided in the main body for storing the rewrite program for executing rewrite of program data, and resetting means for controlling the control means to cancel the rewrite disable state of the rewrite disable means at least once on the basis of the rewrite program when installing the recording medium, and therefore the function for Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A plate recording medium comprising:
   an update data recording region having recorded therein update data for updating data stored in a nonvolatile memory of a portable digital operating apparatus, wherein the plate recording medium is removably installed in the portable digital operating apparatus;
   a program data recording region having recorded therein program loading data for use in transferring the update data from the plate recording medium to the nonvolatile memory of the portable digital operating apparatus; and
   a discrimination data recording region having recorded therein discrimination data for reading by the portable digital operating apparatus to determine whether the plate recording medium has the program loading data recorded thereon;
   a first position recording region for recording first position data indicating a position of the update data recorded in the plate recording medium;
   a management data recording region having recorded therein management data for managing the data recorded in the plate recording medium, separate from the first position recording region in which the first position data is recorded.

2. The plate recording medium of claim 1, further comprising:
   a second position recording region for recording second position data indicating a position of the program data recorded in the plate recording medium.

* * * * *